(12) United States Patent
Torres

(10) Patent No.: US 10,312,230 B2
(45) Date of Patent: Jun. 4, 2019

(54) ESD PROTECTION CIRCUIT HAVING CLAMP CONTROL LOOP

(71) Applicant: FREESCALE SEMICONDUCTOR, INC., Austin, TX (US)

(72) Inventor: Cynthia A. Torres, Austin, TX (US)

(73) Assignee: NXP USA, Inc., Austin, TX (US)

( * ) Notice: Subject to any disclaimer, the term of this patent is extended or adjusted under 35 U.S.C. 154(b) by 404 days.

(21) Appl. No.: 15/015,492

(22) Filed: Feb. 4, 2016

(65) Prior Publication Data

US 2017/0229444 A1 Aug. 10, 2017

(51) Int. Cl.
*H01L 27/02* (2006.01)
*H02H 9/04* (2006.01)

(52) U.S. Cl.
CPC ......... *H01L 27/0266* (2013.01); *H02H 9/041* (2013.01)

(58) Field of Classification Search
CPC . H01L 27/0266; H01L 23/60; H01L 27/0248; H02H 9/041; H02H 9/046; H05K 1/0259
See application file for complete search history.

(56) References Cited

U.S. PATENT DOCUMENTS

| | | | | |
|---|---|---|---|---|
| 5,956,219 A * | 9/1999 | Maloney | ................. | H02H 9/046 361/111 |
| 7,027,275 B2 * | 4/2006 | Smith | ................. | H01L 27/0251 327/374 |
| 9,225,167 B2 * | 12/2015 | Tatsumi | ................. | H02H 9/046 |
| 9,263,884 B2 * | 2/2016 | Kato | ................. | H02H 9/046 |
| 9,438,030 B2 * | 9/2016 | Stockinger | ....... | H03K 19/00315 |
| 2006/0039093 A1 * | 2/2006 | Gauthier, Jr. | ....... | H01L 27/0266 361/56 |
| 2012/0180008 A1 * | 7/2012 | Gist, III | ................. | H02H 9/04 716/101 |
| 2013/0201586 A1 * | 8/2013 | Torres | ................. | H02H 9/046 361/56 |
| 2013/0258533 A1 * | 10/2013 | Chen | ................. | H02H 9/046 361/56 |

(Continued)

OTHER PUBLICATIONS (IEEE Xplore Digital Library [online]. ieeexplore.ieee.org [retrieved on Sep. 25, 2009]. Retrieved from the Internet: <URL: https://ieeexplore.ieee.org/stamp/stamp.jsp?arnumber=5272597>. (Year: 2009).*

(Continued)

*Primary Examiner* — Thienvu V Tran
*Assistant Examiner* — Nicolas Bellido
(74) *Attorney, Agent, or Firm* — Mary Jo Bertani

(57) ABSTRACT

Electrostatic discharge (ESD) protection circuitry in an integrated circuit is provided. The protection circuitry includes a trigger circuit coupled between a first power supply bus and a second power supply bus. A delay circuit is coupled to receive an output signal from the trigger circuit. The delay circuit includes a first inverter coupled to the input of the delay circuit and a feedback transistor having a control terminal coupled to the output of the delay circuit, a first current electrode coupled to the first power supply bus, and a second current electrode coupled to the output of the first inverter. A clamp driver circuit is coupled to the output of the delay circuit.

18 Claims, 3 Drawing Sheets

(56) References Cited

U.S. PATENT DOCUMENTS

| | | | | |
|---|---|---|---|---|
| 2013/0335870 A1* | 12/2013 | Kushibe | ................. | H02H 9/046 |
| | | | | 361/56 |
| 2014/0198415 A1* | 7/2014 | Schulmeyer | ........... | H02H 9/046 |
| | | | | 361/56 |
| 2014/0368957 A1* | 12/2014 | Kato | ..................... | H02H 9/041 |
| | | | | 361/56 |

OTHER PUBLICATIONS

Li et al, "A Compact, Timed-shutoff, MOSFET-based Power Clamp for On-chip ESD Protection", Electrical Overstress/Electrostatic Discharge Symposium, Sep. 19-23, 2004, pp. 1-7.
Merrill et al, "ESD Design Methodology" EOS-ESD Symposium, 1993, 5 pages.

* cited by examiner

ESD PROTECTION CIRCUIT HAVING CLAMP CONTROL LOOP

BACKGROUND

Field

This invention relates in general to electrostatic discharge (ESD) protection for semiconductor devices and more specifically to ESD protection circuits with PFET feedback.
Description of the Related Art An integrated circuit may be subjected to a damaging Electrostatic Discharge (ESD) event in the manufacturing process, during assembly and testing, or in the ultimate system application. In conventional integrated circuit (IC) ESD protection schemes, special ESD protection circuits known as clamp circuits are often used to shunt ESD current between the power supply rails and thereby protect internal elements from damage. A type of ESD clamp circuit, known as an active Metal Oxide Semiconductor Field Effect Transistor (MOSFET) clamp circuit, typically comprises three parts: a trigger circuit, a delay stage, and a large MOSFET transistor. The trigger circuit is designed to respond to an applied ESD event but remains inactive during normal operation of the IC. The delay stage is used to buffer and prolong the trigger output in order to drive the gate terminal of the large MOSFET transistor. The large MOSFET transistor, connected between the two power supply rails, acts as the primary ESD current dissipation device in the clamp circuit. Active MOSFET clamp circuits typically rely on only MOSFET action to absorb ESD events, and since the peak current in an ESD event is on the order of amperes, large MOSFET transistor sizes are required. Active MOSFET clamp circuits may be employed in networks distributed along the power buses to provide robust and consistent ESD protection for all the Input/Output (I/O) pads in the IC.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of various embodiments intended to be illustrative of the invention and should not be taken to be limiting. In embodiments of devices and methods disclosed herein, an ESD protection circuit shunts electrostatic discharge without causing damage to the protection structure or victim devices and does not interfere with normal operation of device. Embodiments disclosed herein require only one feedback loop in a delay stage compared to known ESD protection circuits that require 3 or more feedback loops. As further described herein, the feedback loop activates the clamp on-time during an ESD event, simplifies the ESD protection circuit and reduces risk of oscillations.

The term "transistor," as used herein, refers to a single transistor or an array of transistors, wherein the single transistor or some or all of the transistors of an array of transistors can be implemented as a single-segment transistor or as a transistor comprising a plurality of segments (or "fingers"). Therefore, when referring to the channel width of a clamp transistor device, it should be understood that this represents the total, cumulative channel width of all the transistor segments that are wired in parallel to form the clamp transistor device.

The ESD protection circuits can be employed in various types of electronic devices, such as processors, application specific integrated circuits (ASICs), microcontrollers, systems-on-a-chip (SOCs), and the like. Further, although the circuit implementations disclosed herein are illustrated using metal oxide semiconductor (MOS) transistors, such as silicon substrate and silicon on insulator MOS field effect transistors (MOSFETs), FINFETs, floating gate, or other transistor types, such as bipolar junction transistors, Multiple Independent Gate FETs (MIGFETs) and other materials, such as silicon germanium, can be implemented as appropriate without departing from the scope of the present disclosure. In addition, though the clamp transistor devices are illustrated herein as n-channel MOSFETs, other clamp devices, including p-channel MOSFETs, two or more series n-channel or p-channel MOSFETs, a bipolar junction transistor, or semiconductor controlled rectifiers (SCR) may be used without departing from the scope of the present disclosure.

Figure 1:
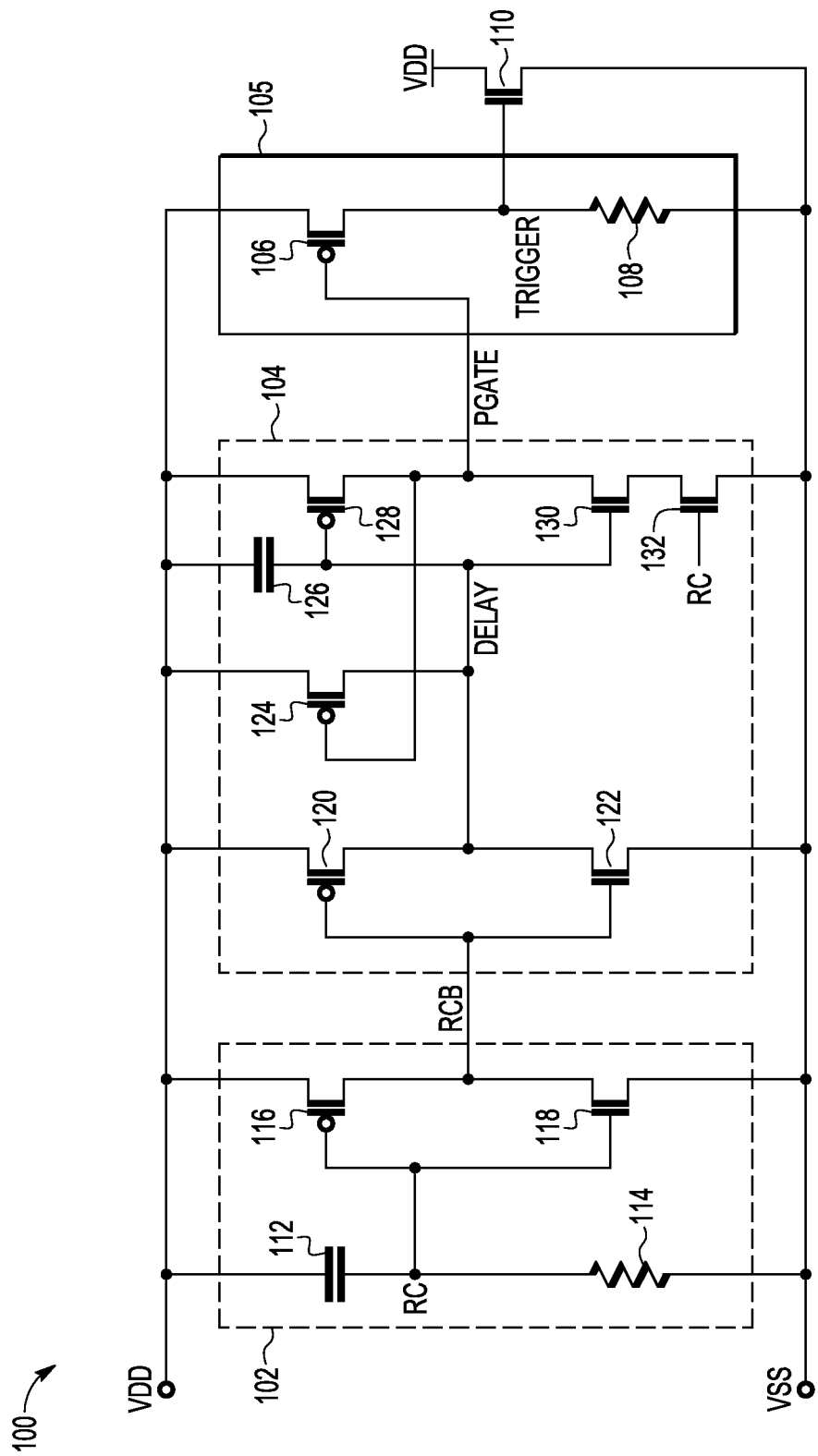
FIG. 1 illustrates a schematic diagram of an integrated circuit device in accordance with selected embodiments of the present disclosure.

FIG. 1 illustrates a schematic diagram of ESD protection circuitry 100 in accordance with selected embodiments of the present disclosure that includes trigger section 102, delay section 104, clamp driver section 105, and clamp transistor 110. Trigger section 102 includes capacitive element 112, resistive element 114, P-channel transistor 116 and N-channel transistor 118. Delay section 104 includes P-channel transistors 120, 124, 128, N-channel transistors 122, 130, 132, and capacitive element 126. Clamp driver section 105 includes P-channel transistor 106 and resistive element 108.

In the trigger section 102 of ESD protection circuitry 100, capacitive element 112 includes a first terminal coupled to voltage supply rail VDD, and a second terminal coupled at node RC to a first terminal of resistive element 114. A second terminal of resistive element 114 is coupled to voltage supply rail VSS, which may be ground or other suitable voltage that is less in magnitude than voltage on supply rail VDD. P-channel transistor 116 includes a first current electrode coupled to supply rail VDD, a second current electrode coupled to a first current electrode of N-channel transistor 118 at node RCB. N-channel transistor 118 further includes a second current electrode coupled to supply rail VSS. Control electrodes of transistors 116, 118 are coupled at node RC between the second terminal of capacitive element 112 and the first terminal of resistive element 114.

In the delay section 104, P-channel transistor 120 includes a first current electrode coupled to supply rail VDD, and a second current electrode coupled to a first current electrode of N-channel transistor 122. N-channel transistor 122 further includes a second current electrode coupled to supply rail VSS. Control electrodes of transistors 120, 122 are coupled to node RCB between the second control electrode of P-channel transistor 116 and the first control electrode of N-channel transistor 118.

P-channel transistor 124 includes a first current electrode coupled to supply rail VDD, a second current electrode coupled between the second current electrode of transistor 120 and the first current electrode of transistor 122 at node DELAY, and a control electrode coupled between a second current electrode of transistor 128 and a first current electrode of transistor 130.

Capacitive element 126 includes a first terminal coupled to supply rail VDD, and a second terminal coupled to a control electrodes of transistors 128 and 130.

P-channel transistor 128 includes a first current electrode coupled to supply rail VDD, and a second current electrode coupled to a first current electrode of N-channel transistor 130. N-channel transistor 130 further includes a second current electrode coupled to a first current electrode of transistor 132. N-channel transistor 132 further includes a second current electrode coupled to supply rail VSS. Control electrodes of transistors 128, 130 are coupled between the second terminal of capacitive element 126. A control electrode of transistor 132 is coupled to voltage at node RC.

In the clamp driver section 105, P-channel transistor 106 includes a first current electrode coupled to supply rail VDD, and a second current electrode coupled to a first terminal of resistive element 108, and a control electrode coupled between the second current electrode of transistor 128 and the first current electrode of transistor 130 at node PGATE. Resistive element 108 further includes a second terminal coupled to supply rail VSS.

Clamp transistor 110 includes a first current electrode coupled to supply voltage VDD, and second control electrode coupled to ground, and a control electrode coupled between the second current electrode of transistor 106 and the first terminal of resistive element 108 at node TRIGGER. Clamp transistor 110 is sized to sink current expected from ESD events, which can be multiple Amperes.

Transistor 128 can be a low voltage threshold device with a higher drive strength than transistor 124, which can be a standard voltage threshold device. For example, the drive strength of transistor 128 can be twice the drive strength of transistor 124.

Transistor 122 has a lower drive strength than the drive strength of transistor 124. For example the width of the gate of transistor 122 can be about half the width of the gate of transistor 124, and/or the length of the gate of transistor 124 can be half the length of the gate of transistor 122. In some embodiments, transistors 124, 128 can be FINFETs with transistor 124 having a greater number of fingers than transistor 122.

Transistors 116 and 118 have approximately the same drive strength.

Figure 3:
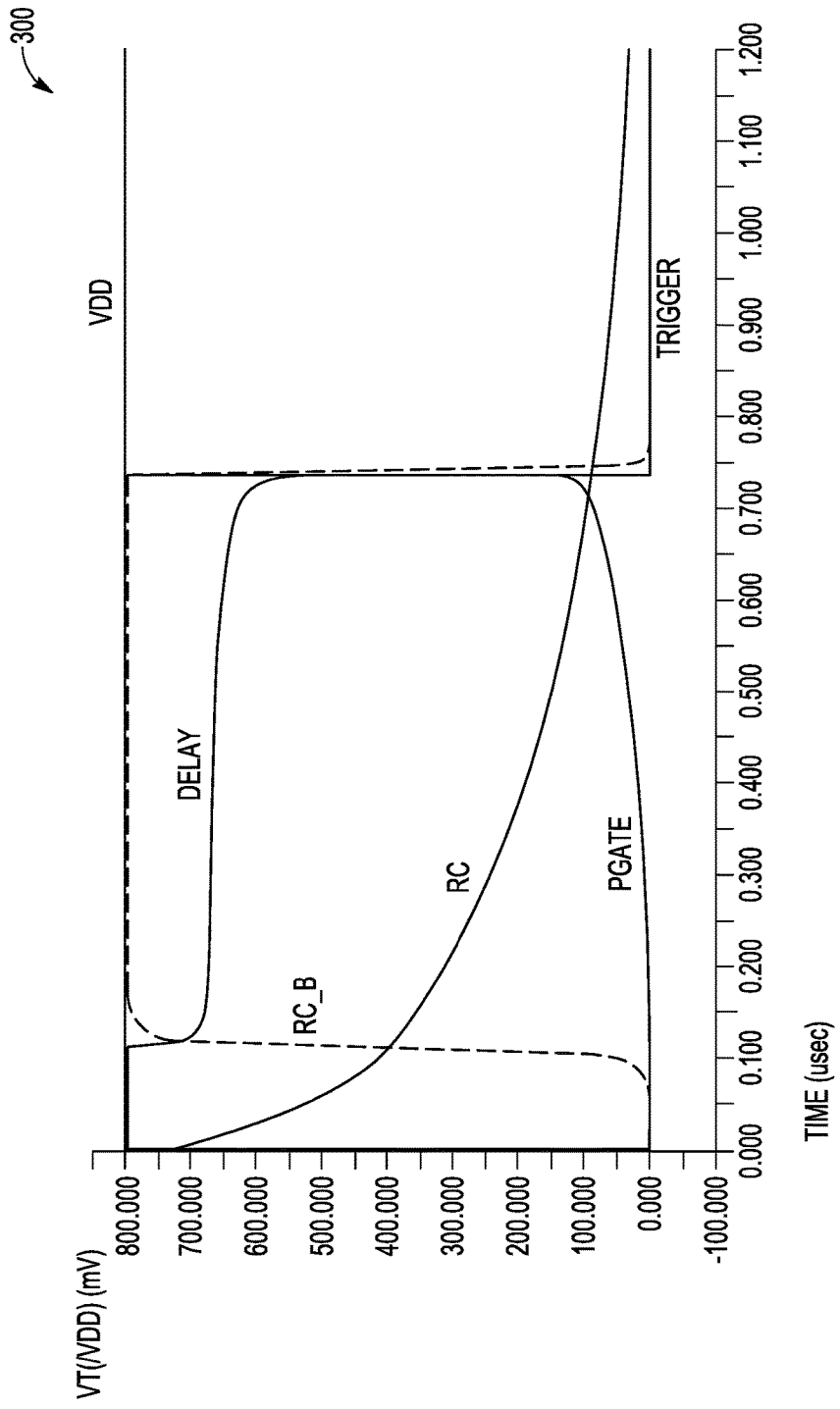
FIG. 3 illustrates an example of a timing diagram showing signals in the integrated circuit device of FIG. 1.

Referring now to FIGS. 1 and 3, FIG. 3 illustrates an example of a timing diagram showing signals in the integrated circuit device of FIG. 1 during operation, in response to an ESD event. At the start of the ESD event, node RC pulls high, causing trigger section 102 to latch and turn on transistor 110. After a time delay of approximately 100 nanoseconds, or other suitable delay, voltage at node RC will drop, causing transistor 122 to turn on and turning off transistors 130, 132. At that point, transistors 122 and 124 are both on and compete to drive node DELAY. The sizing between transistor 122 and transistor 124 enables transistor 122 to pull the node DELAY low enough to turn on transistor 128, which starts to drive node PGATE at the gate of transistor 106, weakening transistor 124. Transistor 122 is able to pull node DELAY lower, allowing transistor 128 to pull the voltage at the gate of transistor 106 to supply voltage VDD and completely shut off transistor 106. Resistive element 108 then pulls node TRIGGER low at the gate of clamp transistor 110 and allows clamp transistor 110 to turn off softly to reduce damage inducing voltage spike associated with false triggering.

When transistor 128 is implemented as a low voltage threshold device, as node DELAY falls, transistor 124 will start to turn off sooner. Capacitive element 126 adds stability to node DELAY and assists in speeding up the rise of voltage at node TRIGGER in an ESD event. In particular, a charge device model (CDM) ESD event has a faster rise time than other types of ESD events such as a human body model (HBM) event.

Figure 2:
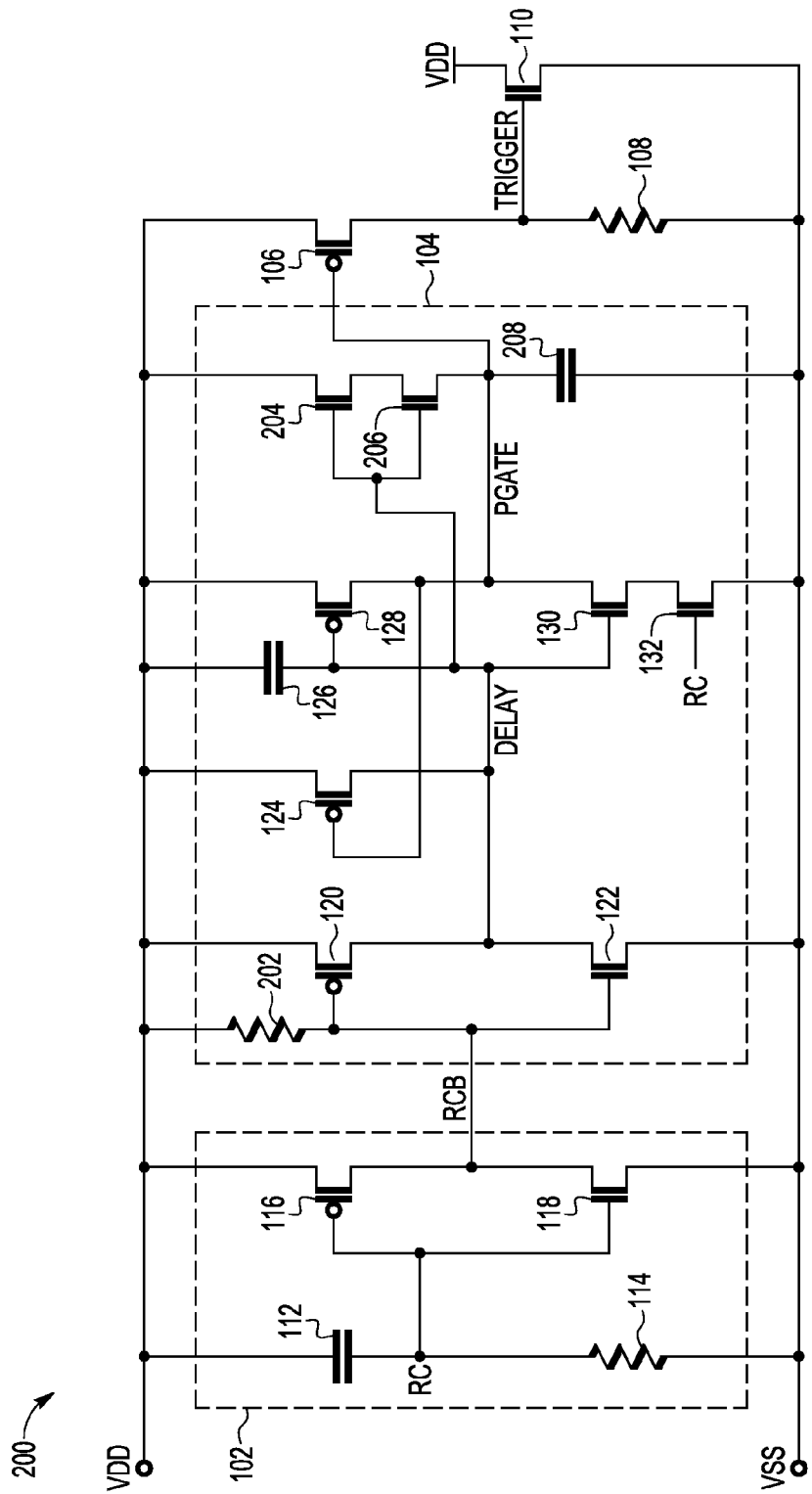
FIG. 2 illustrates a schematic diagram of another integrated circuit device in accordance with selected embodiments of the present disclosure.

FIG. 2 illustrates a schematic diagram of another ESD protection circuit 200 in accordance with selected embodiments of the present disclosure that is similar to ESD protection circuit 100 of FIG. 1, with the exception that transistors 106, 110, 116-124, 128-132 may be subject to process, voltage and temperature (PVT) variations. For example, floating gate transistors with dual gate oxide may be more sensitive to PVT variations that FINFET devices or some other types of devices.

In circuit 200, transistor 124 is used with additional components including N-channel transistors 204, 206, resistive element 202, and capacitive element 208 to ensure clamp turn-off despite the presence of PVT variations. Resistive element 202 includes a first terminal coupled to supply voltage rail VDD and a second terminal coupled to node RCB. Transistor 204 includes a first current electrode coupled to supply voltage rail VDD, a second current electrode coupled to a first current electrode of transistor 206, and a control electrode coupled to node DELAY. Transistor 206 further includes a second current electrode coupled to node PGATE and a control electrode coupled to node DELAY. Capacitive element 208 includes a second terminal coupled to supply voltage rail VSS.

During operation after an ESD event occurs, transistors 204, 206 are in a conductive mode, which helps drive voltage at node PGATE to supply voltage VDD and place transistor 106 in non-conductive mode, thereby shutting off transistor 110. Capacitor 208 is charged to VDD while transistors 204 and 206 are in conductive mode, and capacitor 208 helps smooth the response at node PGATE when transistors 204 and 206 are placed in non-conductive mode when node DELAY drops below the threshold voltage of transistor 204 and 206. Resistor 202 is placed to help transistor 120 shut off when the voltage at node RCB is not strong enough to turn off P-channel transistor 120 during an ESD event.

By now it should be appreciated that ESD protection circuits 100, 200 requires only one feedback transistor 124, with transistors 124, 126 having different threshold voltages, and transistors 122, 124 having different sizes to delay turning off clamp transistor 110. Transistor 124 is driven by feedback to compete with transistor 122 in the on state. Transistor 128 initially drives voltage at node PGATE with sub-threshold current, but as voltage at node DELAY falls, voltage at node PGATE is driven high, allowing a weak latch comprising transistors 120 and 122 to reset without cycling power at supply voltage rail VDD.

In selected embodiments, an integrated circuit can comprise a trigger circuit (102) coupled between a first power supply bus (VDD) and a second power supply bus (VSS), a delay circuit (104) having an input coupled to receive an output signal from the trigger circuit and an output, the delay circuit including a first inverter (120, 122) having an input and an output, the input coupled to the input of the delay circuit; and a feedback transistor (124) having a control terminal coupled to the output of the delay circuit, a first current electrode coupled to the first power supply bus, and a second current electrode coupled to the output of the first inverter. A clamp driver circuit (106, 108) has an input coupled to the output of the delay circuit, and an output.

In another aspect, the integrated circuit can further comprise a clamp transistor (110) having a control electrode coupled to the output of the clamp driver circuit, a first current electrode coupled to the first power supply bus, and a second current electrode coupled to the second power supply bus.

In another aspect, the trigger circuit can include a first capacitive element (112) and a first resistive element (114) coupled in series between the first power supply bus and the second power supply bus.

In another aspect, the delay circuit further can include a second inverter (128, 130), the second inverter having an input coupled to the output of the first inverter, and an output coupled to the control terminal of the feedback transistor and to the output of the delay circuit.

In another aspect, the first inverter can include a first P-channel transistor (120) and a first N-channel transistor (122) coupled in series, and the second inverter includes a second P-channel transistor (128) and a second N-channel transistor (130) coupled in series, and wherein a drive strength of the first N-channel transistor is less than a drive strength of the feedback transistor.

In another aspect, the feedback transistor can be characterized as a P-channel transistor (124), and wherein the first N-channel transistor has a width approximately one-half or less of the width of the feedback transistor.

In another aspect, the delay circuit further can include a third N-channel transistor (132) coupled between the second N-channel transistor and the second power supply bus, a control electrode of the third N-channel transistor coupled to a common node (RC) between the first capacitive element and the first resistive element.

In another aspect, the clamp driver circuit further can comprise a third P-channel transistor (106) and a second resistive element (108) coupled in series between the first power supply bus and the second power supply bus.

In another aspect, the delay circuit further can include a second capacitive element (126) having a first terminal coupled to the first power supply bus, and a second terminal coupled to the output of the first inverter.

In another aspect, the delay circuit further can include a fourth N-channel transistor (204) and a fifth N-channel transistor (206) coupled in series between the first power supply bus and the output of the delay circuit, control electrodes of the fourth and fifth N-channel transistors coupled to the output of the first inverter.

In another aspect, the delay circuit further can include a third capacitive element (208) having a first terminal coupled to the output of the delay circuit, and a second terminal coupled to the second power supply bus.

In another aspect, the delay circuit further can include a third resistive element (202) having a first terminal coupled to the first power supply bus, and a second terminal coupled to the input of the delay circuit.

In other selected embodiments, an integrated circuit can comprise a trigger circuit (102) coupled between a first power supply bus (VDD) and a second power supply bus (VSS), the trigger circuit including a first capacitive element (112) and a first resistive element (114) coupled in series between the first power supply bus and the second power supply bus, a delay circuit (104) having an input coupled to receive an output signal (RCB) from the trigger circuit and an output, the delay circuit including a first inverter having an input coupled to the input of the delay circuit and an output, the first inverter including a first P-channel transistor (120) and a first N-channel transistor (122) coupled in series between the first power supply bus and the second power supply bus. A feedback transistor (124) can have a control terminal coupled to the output of the delay circuit, a first current electrode coupled to the first power supply bus, and a second current electrode coupled to the output of the first inverter. A clamp driver circuit (106, 108) can have an input coupled to the output of the delay circuit, and an output.

In another aspect, the integrated circuit further can include a clamp transistor (110) having a control electrode coupled to the output of the clamp driver circuit, a first current electrode coupled to the first power supply bus, and a second current electrode coupled to the second power supply bus.

In another aspect, the delay circuit further includes a second inverter, the second inverter including a second P-channel transistor (128) and a second N-channel transistor (130) coupled in series between the first power supply bus and a first current electrode of an N-channel enable transistor (132), the control electrode of the enable transistor coupled to a common node (RC) between the first capacitive element and the first resistive element.

In another aspect, the trigger circuit further comprises a third inverter having an input coupled to the common node (RC) between the first capacitive element and the first resistive element, and an output (RCB) coupled to the output of the trigger circuit, the third inverter including a third P-channel transistor (116) and a third N-channel transistor (118) coupled in series between the first power supply bus and the second power supply bus.

In another aspect, the feedback transistor is characterized as a P-channel transistor, and wherein a length of the first N-channel transistor is approximately twice or more than a length of the feedback transistor.

In another aspect, the delay circuit further can include a second capacitive element (126) having a first terminal coupled to the first power supply bus, and a second terminal coupled to the output of the first inverter.

In another aspect, the clamp driver circuit further includes a P-channel driver transistor (106) and a second resistive element (108) coupled in series between the first power supply bus and the second power supply bus, a control electrode of the driver transistor coupled to the output of the delay circuit.

In another aspect, the delay circuit further can include a fourth N-channel transistor (204) and a fifth N-channel transistor (206) coupled in series between the first power supply bus and the output of the delay circuit, control electrodes of the fourth and fifth N-channel transistors coupled to the output of the first inverter.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, embodiments of the integrated circuit disclosed herein can be connected to a boost bus network where trigger section 102, delay section 104, and clamp driver section 105 (FIGS. 1 and 2) connect to a boost bus instead of VDD. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
    a trigger circuit between a first power supply bus and a second power supply bus;
    a delay circuit having an input coupled to receive an output signal from the trigger circuit and an output, the delay circuit including:
        a first inverter having an input and an output, the input coupled to the input of the delay circuit;
        a feedback transistor having a control terminal coupled to the output of the delay circuit, a first current electrode coupled to the first power supply bus, and a second current electrode coupled to the output of the first inverter; and
        a second capacitive element having a first terminal coupled to the first power supply bus and a second terminal coupled to the output of the first inverter; and
    a clamp driver circuit having an input coupled to the output of the delay circuit, and an output.

2. The integrated circuit of claim 1, further comprising a clamp transistor having a control electrode coupled to the output of the clamp driver circuit, a first current electrode coupled to the first power supply bus, and a second current electrode coupled to the second power supply bus.

3. The integrated circuit of claim 1, wherein the trigger circuit includes a first capacitive element and a first resistive element coupled in series between the first power supply bus and the second power supply bus.

4. The integrated circuit of claim 3, wherein the delay circuit further includes a second inverter, the second inverter having an input coupled to the output of the first inverter, and an output coupled to the control terminal of the feedback transistor and to the output of the delay circuit.

5. The integrated circuit of claim 4, wherein the first inverter includes a first P-channel transistor and a first N-channel transistor coupled in series, and the second inverter includes a second P-channel transistor and a second N-channel transistor coupled in series, and wherein a drive strength of the first N-channel transistor is less than a drive strength of the feedback transistor.

6. The integrated circuit of claim 5, wherein the feedback transistor is characterized as a P-channel transistor, and wherein the first N-channel transistor has a width approximately one-half or less of the width of the feedback transistor.

7. The integrated circuit of claim 5, further comprising a third N-channel transistor coupled between the second N-channel transistor and the second power supply bus, a control electrode of the third N-channel transistor coupled to a common node between the first capacitive element and the first resistive element.

8. The integrated circuit of claim 1, wherein the clamp driver circuit further comprises a third P-channel transistor and a second resistive element coupled in series between the first power supply bus and the second power supply bus.

9. The integrated circuit of claim 1, further comprising a fourth N-channel transistor and a fifth N-channel transistor coupled in series between the first power supply bus and the output of the delay circuit, control electrodes of the fourth and fifth N-channel transistors coupled to the output of the first inverter.

10. The integrated circuit of claim 9, further comprising a third capacitive element having a first terminal coupled to the output of the delay circuit, and a second terminal coupled to the second power supply bus.

11. The integrated circuit of claim 10, further comprising a third resistive element having a first terminal coupled to the first power supply bus, and a second terminal coupled to the input of the delay circuit.

12. An integrated circuit comprising:
    a trigger circuit coupled between a first power supply bus and a second power supply bus, the trigger circuit including a first capacitive element and a first resistive element coupled in series between the first power supply bus and the second power supply bus;
    a delay circuit having an input coupled to receive an output signal from the trigger circuit and an output, the delay circuit including:
        a first inverter having an input coupled to the input of the delay circuit and an output, the first inverter including a first P-channel transistor and a first N-channel transistor coupled in series between the first power supply bus and the second power supply bus;
        a feedback transistor having a control terminal coupled to the output of the delay circuit, a first current electrode coupled to the first power supply bus, and a second current electrode coupled to the output of the first inverter; and
        a second capacitive element having a first terminal coupled to the first power supply bus, and a second terminal coupled to the output of the first inverter; and a clamp driver circuit having an input coupled to the output of the delay circuit, and an output.

13. The integrated circuit of claim 12, further comprising a clamp driver circuit having a control electrode coupled to the output of the clamp driver circuit, a first current electrode coupled to the first power supply bus, and a second current electrode coupled to the second power supply bus.

14. The integrated circuit of claim 12, wherein the delay circuit further includes a second inverter, the second inverter including a second P-channel transistor and a second N-channel transistor coupled in series between the first power supply bus and a first current electrode of an N-channel enable transistor, the control electrode of the enable transistor coupled to a common node between the first capacitive element and the first resistive element.

15. The integrated circuit of claim 14, wherein the trigger circuit further comprises a third inverter having an input coupled to the common node between the first capacitive element and the first resistive element, and an output coupled to the output of the trigger circuit, the third inverter including a third P-channel transistor and a third N-channel transistor coupled in series between the first power supply bus and the second power supply bus.

16. The integrated circuit of claim 12, wherein the feedback transistor is characterized as a P-channel transistor, and wherein a length of the first N-channel transistor is approximately twice or more than a length of the feedback transistor.

17. The integrated circuit of claim 13, wherein the clamp driver circuit further includes a P-channel driver transistor and a second resistive element coupled in series between the first power supply bus and the second power supply bus, a control electrode of the driver transistor coupled to the output of the delay circuit.

18. The integrated circuit of claim 12, further comprising a fourth N-channel transistor and a fifth N-channel transistor coupled in series between the first power supply bus and the output of the delay circuit, control electrodes of the fourth and fifth N-channel transistors coupled to the output of the first inverter.

\* \* \* \* \*